(12) United States Patent
Liu

(10) Patent No.: US 8,451,625 B2
(45) Date of Patent: May 28, 2013

(54) ELECTRONIC DEVICE WITH FIXING MECHANISM

(75) Inventor: Zhi-Hua Liu, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 314 days.

(21) Appl. No.: 12/894,575

(22) Filed: Sep. 30, 2010

(65) Prior Publication Data

US 2011/0157849 A1  Jun. 30, 2011

(30) Foreign Application Priority Data

Dec. 25, 2009 (CN) .......................... 2009 1 0312310

(51) Int. Cl.
*H05K 7/02* (2006.01)

(52) U.S. Cl.
USPC .......................................................... 361/807

(58) Field of Classification Search
USPC ................. 361/807, 715, 742, 752, 753, 767, 361/770, 808
See application file for complete search history.

(56) References Cited

U.S. PATENT DOCUMENTS 6,560,119 B1 * 5/2003 Katsuyama et al. .......... 361/752

\* cited by examiner

*Primary Examiner* — Jeremy Norris
*Assistant Examiner* — Tremesha S Willis
(74) *Attorney, Agent, or Firm* — Altis Law Group, Inc.

(57) ABSTRACT

An electronic device includes a housing, a printed circuit board (PCB) defining a mounting hole and one or more fixing mechanisms. The fixing mechanism includes a fixing member and a screw. The fixing member includes a main body and a number of elastic connection portions interconnecting the housing and the main body for adjusting a position of the main body relative to the housing. The main body defines a threaded hole. The screw passes through the mounting hole of the PCB and is threaded into the threaded hole of the main body, to fix the PCB on the main body.

12 Claims, 4 Drawing Sheets

ELECTRONIC DEVICE WITH FIXING MECHANISM

BACKGROUND

1. Technical Field

The present disclosure relates generally to electronic devices, particularly, to an electronic device having a fixing mechanism.

2. Description of Related Art

Electronic devices generally include a housing and a printed circuit board (PCB) received in the housing. To ensure the stability and reliability of the electronic devices, various fixing members are employed to fix the PCB to the housing.

A commonly used fixing member includes a standoff located on the housing defining a threaded hole, and a screw extending through the PCB fixedly received in the threaded hole of the standoff. However, sometimes the standoff is not exactly perpendicular to the PCB, and the screw may be prone to press against or scratch a surface of the PCB during assembly.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
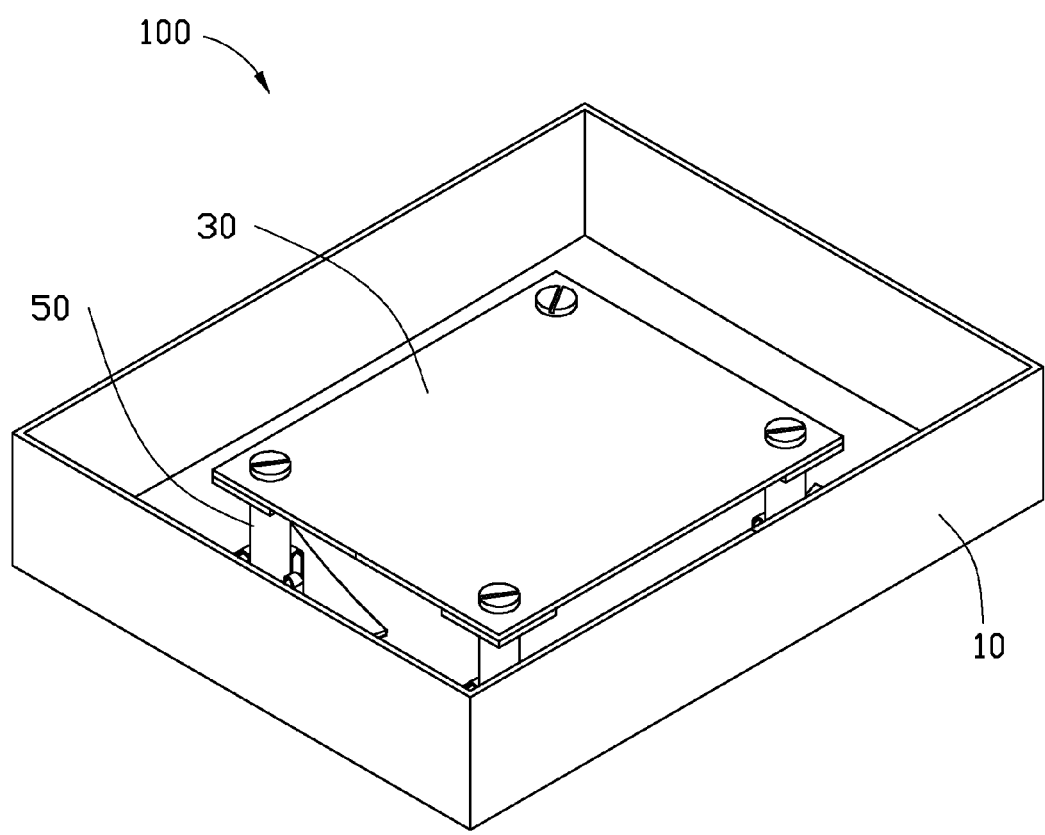
FIG. 1 is an isometric view of an embodiment of part of an enclosure of an electronic device.
Figure 2:
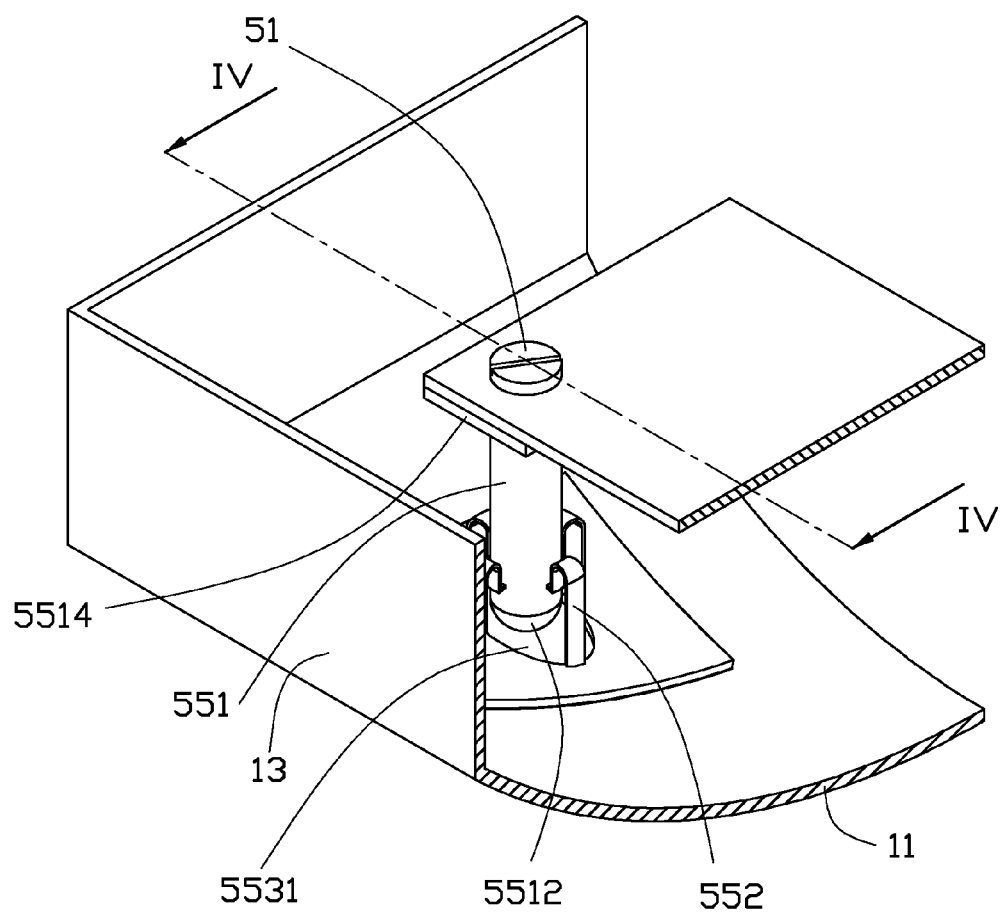
FIG. 2 is a partially, enlarged, isometric view of the electronic device of FIG. 1.

Referring to FIGS. 1 and 2, an embodiment of an electronic device 100 includes a housing 10, a printed circuit board (PCB) 30, and four fixing mechanisms 50. The electronic device 100 can be a mobile phone, personal digital assistant (PDA), or display devices. In the illustrated embodiment, the electronic device 100 is a display device for a personal computer, which includes various modules to perform corresponding functions and features, however, for simplicity, in the following embodiment only one of the fixing mechanisms 50 for the PCB 20 is described.

The housing 10 includes a substantially curved bottom wall 11, and four side walls 13 extending from a periphery of the bottom wall 11, respectively. The PCB 30 is substantially rectangular and is fixed to the bottom wall 11 with four fixing members 50, and the four fixing members 50 are respectively positioned substantially adjacent to four corners of the PCB 30.

Figure 3:
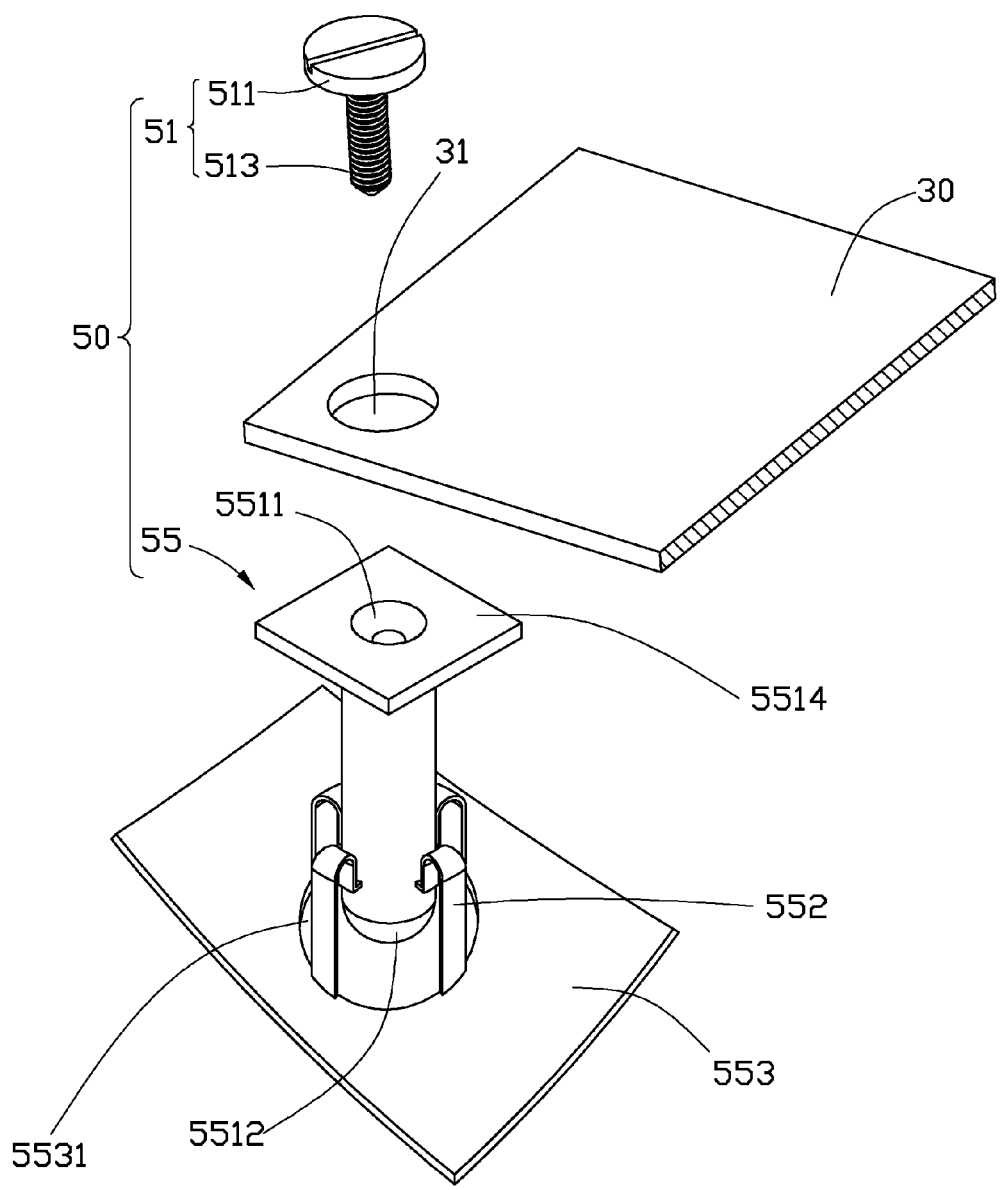
FIG. 3 is an exploded, isometric view of the electronic device of FIG. 2.
Figure 4:
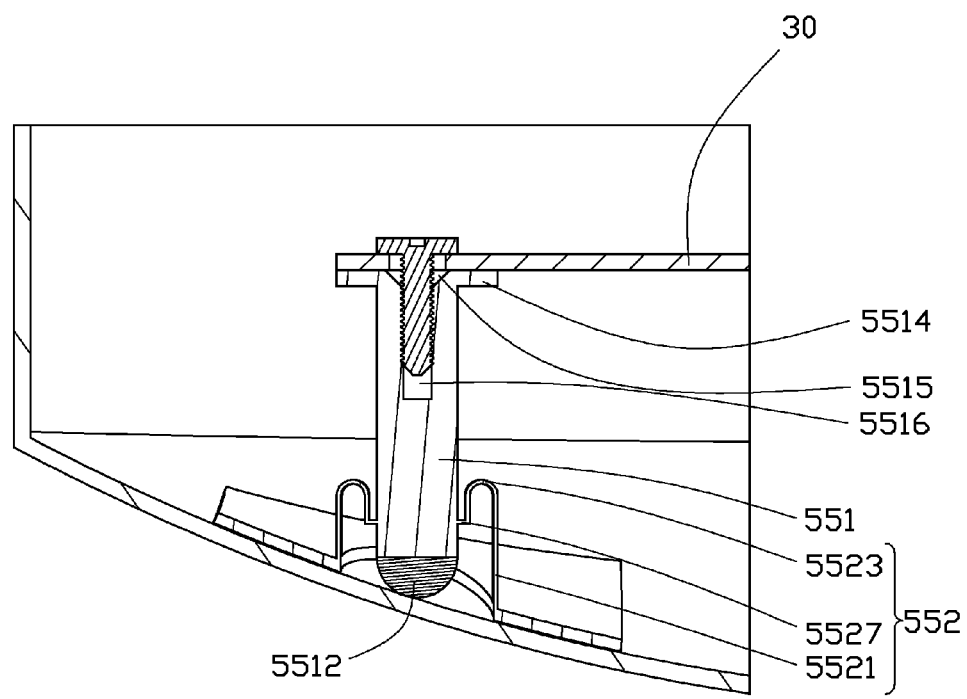
FIG. 4 is a cross-section of the fixing member in FIG. 2 taken along the line IV-IV.

Referring to FIGS. 3 and 4, the PCB 30 defines a substantially circular mounting hole 31 adjacent to a corner of the PCB 30. The fixing mechanism 50 includes a screw 51 and a fixing member 55.

The screw 51 includes a head portion 511 and a threaded portion 513 extending from one side of the head portion 511. The diameter of the head portion 511 is greater than that of the mounting hole 31, and the diameter of the threaded portion 513 is less than that of the mounting hole 31.

The fixing member 55 includes a cylindrical main body 551, a number of elastic connection portions 552 for supporting the main body 551 and a fixable portion 553 under the connection portions 552. The main body 551 includes a fixing end 5511 and a substantially hemispherical adjusting end 5512 opposite to the fixing end 5511. The main body 551 forms a flange 5514 extending radially from the fixing end 5511. The main body 551 defines a tapered guide hole 5515 and a threaded hole 5516 communicating with the guide hole 5515. The threaded hole 5516 mounts the screw 51. The guide hole 5515 guides the screw 51 when the screw 51 is screwed into the threaded hole 5516. In the illustrated embodiment, the number of the connection portions 552 is four. Alternatively, the number of the connection portions 522 may be two, three, five or more.

The connection portion 552 includes a longitudinal base portion 5521, a bendable portion 5523 and a contact portion 5527. In the illustrated embodiment, the connection portion 552 is a bendable metal sheet; the bendable portion 5523 is located between the base portion 5521 and the contact portion 5527. A gap is formed between the base portion 5521 and the contact portion 5527 (as shown in FIGS. 2 through 4). The end of the base portion 5521 away from the bendable portion 5523 is connected to the fixable portion 553, and the four connection portions 552 are surrounding a through hole 5531. An end of the contact portion 5527 away from the bendable portion 5523 is connected to the main body 551, thus mounting the main body 551 to the fixable portion 553, and an axis of the main body 551 is substantially parallel with the base portion 5521. The bendable portion 5523 compresses or extends, so as to move the main body 551 axially or radially, to align the main body 551 with the mounting hole 31 of the PCB 30.

The fixable portion 553 is a curved metal sheet matching with the bottom surface 11. The fixable portion 553 may be fixed to the bottom surface 11 by gluing or welding. The fixable portion 553 defines the through hole 5531 corresponding to the adjusting end 5512 of the main body 551. The four connection portions 552 are connected to the fixable portion 553, and surround the through hole 5531, thus the range of movement of the adjusting end 5512 is thereby increased. In the illustrated embodiment, the adjusting end 5512 is metal. Alternatively, the adjusting end 5512 may be elastic material, such as plastic.

In assembly, the fixable portion 553 of the fixing member 55 is attached to the bottom surface 11 of housing 10. The PCB 30 is positioned on the fixing member 55, and the mounting hole 31 of the PCB 30 communicates with the guide hole 5515 of the fixing member 55. The threaded portion 513 of the screw 51 passes through the mounting hole 31, then the guide hole 5515 in that order, and finally is threaded into the threaded hole 5516. The flange 5514 of the fixing member 55 abuts the PCB 30, to fix the PCB 30 on the housing 10.

If any manufacturing error has occurred, the main body 551 of the fixing member 55 may not be perpendicular with the PCB 30. When the screw 51 passes through the guide hole 5515 and is screwed into the threaded hole 5516, the threaded portion 513 of the screw 51 abuts a side surface of the guide hole 5515. The connection portions 552 are thereby compressed or extended, and the position of the main body 551 is adjusted, to align the main body 551 with the mounting hole 31.

It should be noted that the guide hole 5515 may be omitted, and the position of the main body 551 may be adjusted by an external force applied to the main body 551. The contact portion 5527 and the base portion 5521 may also be omitted, and then the bendable portion 5523 directly interconnects the main body 551 and the fixable portion 553.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device, comprising: a housing; a printed circuit board (PCB) defining a mounting hole; and a fixing mechanism comprising: a fixing member comprising a main body and a plurality of elastic connection portions interconnecting the housing and the main body for adjusting a position of the main body relative to the housing, the main body defining a threaded hole, and each of the plurality of elastic connection portions comprising a longitudinal base portion, a bendable portion and a contact portion, the bendable portion connected between the base portion and the contact portion, a gap being formed between the base portion and the contact portion, one end of the longitudinal base portion away from the bendable portion connecting with the housing, one end of the contact portion away from the bendable portion connecting with the main body; and a screw passing through the mounting hole of the PCB and received in the threaded hole of the main body, to fix the PCB on the main body.

2. The electronic device of claim 1, wherein the screw comprises a threaded portion received in the threaded hole of the main body and a head portion abutting the PCB.

3. The electronic device of claim 1, wherein the fixing member comprises a fixable portion fixed on a bottom surface of the housing, and the base portion is connected to the fixable portion.

4. The electronic device of claim 1, wherein the main body comprises a fixing end and an adjusting end opposite to the fixing end, the adjusting end is substantially hemispherical, and the threaded hole is defined at the fixing end.

5. The electronic device of claim 4, wherein the fixable portion defines a through hole corresponding to the adjusting end.

6. The electronic device of claim 4, wherein the main body forms a flange abutting the PCB at the fixing end.

7. An electronic device, comprising: a housing; a printed circuit board (PCB) defining a mounting hole; a fixing mechanism comprising: a fixing member comprising a main body and a plurality of elastic connection portions interconnecting the housing and the main body for adjusting a position of the main body relative to the housing, the main body defining a threaded hole and a tapered guide hole communicating with the threaded hole, and each of the plurality of elastic connection portions comprising a longitudinal base portion, a bendable portion and a contact portion, the bendable portion connected between the base portion and the contact portion, a gap being formed between the base portion and the contact portion, one end of the longitudinal base portion away from the bendable portion connecting with the housing, one end of the contact portion away from the bendable portion connecting with the main body; and a screw passing through the guide hole of the main body, the mounting hole of the PCB and received in the threaded hole of the main body, to fix the PCB on the main body.

8. The electronic device of claim 7, wherein the screw comprises a threaded portion received in the threaded hole of the main body and a head portion abutting the PCB.

9. The electronic device of claim 7, wherein the fixing member comprises a fixable portion fixed on a bottom surface of the housing, and the base portion is connected to the fixable portion.

10. The electronic device of claim 9, wherein the connection portion comprises a base portion fixed on the fixable portion and a bendable portion formed on an end of the base portion away from the fixable portion.

11. The electronic device of claim 7, wherein the fixable portion defines a through hole corresponding to the adjusting end.

12. The electronic device of claim 7, wherein the main body forms a flange abutting the PCB at the fixing end.

* * * * *